(12) United States Patent
Date et al.

(10) Patent No.: US 8,507,389 B2
(45) Date of Patent: Aug. 13, 2013

(54) METHODS FOR FORMING DIELECTRIC LAYERS

(75) Inventors: Lucien Date, Ottignies LLN (BE); Paul William Turnbull, Morpeth (GB)

(73) Assignee: Applied Materials, Inc., Santa Clara, CA (US)

( * ) Notice: Subject to any disclaimer, the term of this patent is extended or adjusted under 35 U.S.C. 154(b) by 290 days.

(21) Appl. No.: 12/835,866

(22) Filed: Jul. 14, 2010

(65) Prior Publication Data

US 2011/0039419 A1    Feb. 17, 2011

Related U.S. Application Data

(60) Provisional application No. 61/226,375, filed on Jul. 17, 2009.

(51) Int. Cl.
*H01L 21/31* (2006.01)
*H01L 21/469* (2006.01)

(52) U.S. Cl.
USPC ............. 438/763; 438/785; 257/E21.24

(58) Field of Classification Search
USPC ............. 438/763, 785–887; 257/E21.24
See application file for complete search history.

(56) References Cited

U.S. PATENT DOCUMENTS

| | | | |
|---|---|---|---|
| 7,396,565 | B2 | 7/2008 | Yang et al. |
| 2002/0081844 | A1 | 6/2002 | Jeon et al. |
| 2004/0198069 | A1 | 10/2004 | Metzner et al. |
| 2005/0235905 | A1 | 10/2005 | Senzaki et al. |
| 2006/0205186 | A1 | 9/2006 | Park et al. |
| 2008/0044569 | A1 | 2/2008 | Myo et al. |

FOREIGN PATENT DOCUMENTS

| WO | WO 2005/113852 A2 | 12/2005 |
|---|---|---|
| WO | WO 2006/110750 A2 | 10/2006 |

OTHER PUBLICATIONS

International Search Report and Written Opinion mailed Jan. 28, 2011 for PCT Application No. PCT/US2010/042093.

*Primary Examiner* — Chuong A Luu
*Assistant Examiner* — Nga Doan
(74) *Attorney, Agent, or Firm* — Moser Toboada; Alan Toboada

(57) ABSTRACT

Methods for forming a dielectric layer on a substrate are provided herein. In some embodiments a method for forming a dielectric layer on a substrate may include exposing the substrate to a first source gas comprising a silicon precursor and an oxidizer for a first period of time to form a first layer comprising silicon and oxygen; and exposing the substrate to a second source gas comprising a metal precursor and the silicon precursor for a second period of time to form a second layer comprising silicon and a metal, where in the first layer and the second layer form the dielectric layer.

20 Claims, 2 Drawing Sheets

METHODS FOR FORMING DIELECTRIC LAYERS

CROSS-REFERENCE TO RELATED APPLICATIONS

This application claims benefit of U.S. provisional patent application Ser. No. 61/226,375, filed Jul. 17, 2009, which is herein incorporated by reference in its entirety.

FIELD

Embodiments of the present invention generally relate to substrate processing and, more particularly, to methods of forming dielectric layers on substrates via atomic layer deposition (ALD).

BACKGROUND

In the field of semiconductor, flat-panel display, or other electronic device processing, vapor deposition processes have played an important role in depositing materials on substrates. As the geometries of electronic devices continue to shrink and the density of devices continue to increase, overall feature size has decreased and aspect ratio has increased. While conventional chemical vapor deposition (CVD) processes have proved successful, shrinking device geometries require an alternative deposition technique, such as atomic layer deposition (ALD).

A conventional ALD process involves sequentially exposing a substrate to chemical precursors and reactants. Typically, a chemical precursor is provided to a process chamber having a substrate, which is adsorbed onto the surfaces of the substrate. A reactant is then provided to the process chamber, which reacts with the chemical precursor, resulting in a deposition of material.

ALD processes generally allow for improved coverage of surfaces within substrate features over a conventional CVD process. However, ALD process typically have slower deposition rates than comparable CVD processes for depositing materials having similar compositions.

Therefore, a need exists for an improved method of processing substrates using ALD.

SUMMARY

Methods for forming a dielectric layer on a substrate are provided herein. In some embodiments a method for forming a dielectric layer on a substrate may include exposing the substrate to a first source gas comprising a silicon (Si) precursor and an oxidizer for a first period of time to form a first layer comprising silicon and oxygen; and exposing the substrate to a second source gas comprising a metal precursor and the silicon precursor for a second period of time to form a second layer comprising silicon and a metal, where in the first layer and the second layer form the dielectric layer.

In some embodiments, methods for forming a dielectric layer may include exposing the substrate to a first source gas comprising a silicon precursor and an metal precursor for a first period of time to form a first layer comprising silicon and a metal; and exposing the substrate to a second source gas comprising a silicon precursor and an oxidizer for a second period of time to form a second layer comprising silicon and oxygen, wherein the first layer and the second layer form the dielectric layer.

BRIEF DESCRIPTION OF THE DRAWINGS

Embodiments of the present invention, briefly summarized above and discussed in detail below, can be understood by reference to the illustrative embodiments of the invention depicted in the appended drawings. It is to be noted, however, that the appended drawings illustrate only exemplary embodiments of this invention and are therefore not to be considered limiting of its scope, for the invention may admit to other equally effective embodiments.

Figure 1:
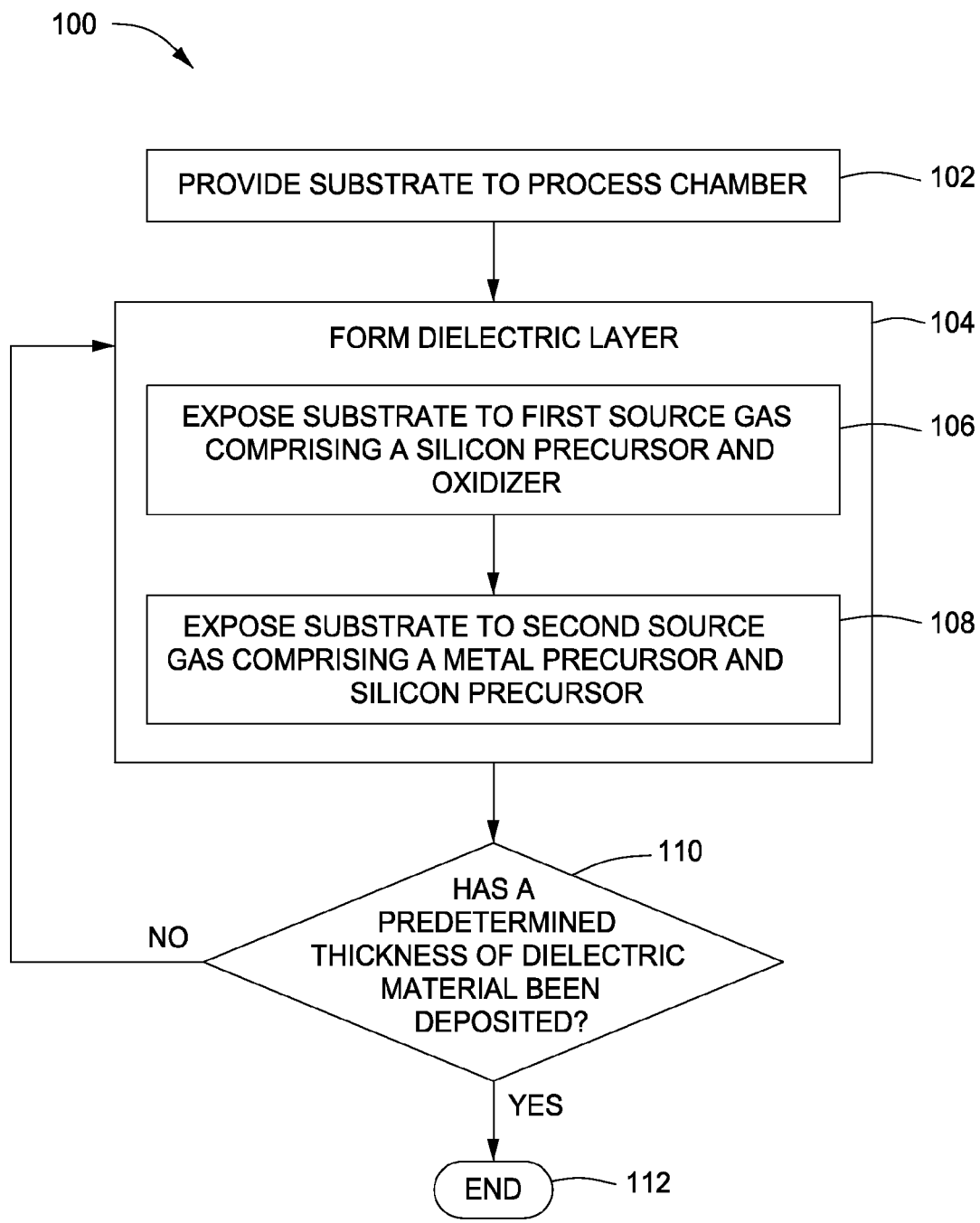
FIG. 1 depicts a method for forming a dielectric layer on a substrate in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention generally relate to methods of forming dielectric layers on substrates via atomic layer deposition. The inventive methods may advantageously increase productivity and efficiency of processing semiconductor substrates and further may provide a dielectric layer with significant improvement in one or more of compositional uniformity, thickness uniformity, and increases rate of deposition.

FIG. 1 depicts a method for forming a dielectric layer on a substrate in accordance with some embodiments of the present invention. The above method may be performed in any apparatus suitable for processing substrates in accordance with embodiments of the present invention, such as discussed below with respect to FIG. 2.

The method 100, begins at 102, where a substrate, having a surface upon which a dielectric layer is to be formed, is provided. As used herein, a "substrate surface" refers to any substrate surface upon which a layer may be formed. The substrate surface may have one or more features formed therein, one or more layers formed thereon, and combinations thereof. The substrate (or substrate surface) may be pretreated prior to the deposition of the dielectric layer, for example, by polishing, etching, reduction, oxidation, halogenation, hydroxylation, annealing, baking, or the like.

The substrate may be any substrate capable of having material deposited thereon, such as a silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a solar array, solar panel, a light emitting diode (LED) substrate, a semiconductor wafer, or the like.

Next, at 104, a dielectric layer is formed on the substrate. In some embodiments, the dielectric layer may be deposited via a cyclical deposition process, for example, such as atomic layer deposition, or the like. In some embodiments, the dielectric layer is a high-K dielectric layer, for example, having a dielectric constant equal to or greater than about 9. In some embodiments, the dielectric layer is a metal silicate film, such as, for example, hafnium silicate ($HfSiO_x$), hafnium silicon nitride ($Hf_xSi_yN$), aluminum silicon oxynitride ($AlSi_xO_yN_z$), or the like. The subscripts (x,y,z) imply that stoichiometry or composition may be intentionally varied via sequences of the cyclical deposition process to form the compounds.

In some embodiments, the forming of a dielectric layer via a cyclical deposition process may generally comprise exposing the substrate to two or more source gases sequentially. In some embodiments, each source gas may be separated by a time delay/pause to allow the components of the source gas to adhere and/or react on the substrate surface. For example, a first source gas may be dosed/pulsed into a reaction zone followed by a first time delay/pause. Next, a second source gas may be dosed/pulsed into the reaction zone followed by a second time delay. This sequence may be repeated until a desired layer thickness is formed on the substrate surface.

A "reaction zone" is intended to include any volume that is in fluid communication with a substrate surface being processed. The reaction zone may include any volume within a processing chamber that is between a gas source and the substrate surface. For example, the reaction zone includes any volume in which a substrate is disposed that is downstream of a dosing valve.

A "pulse/dose" as used herein is intended to refer to a quantity of a source gas that is intermittently or non-continuously introduced into a reaction zone of a process chamber. The quantity of a particular compound within each pulse may vary over time, depending on the duration of the pulse. A particular source gas may include a single compound or a mixture/combination of two or more compounds.

The durations for each pulse/dose are variable and may be adjusted to accommodate, for example, the volume capacity of the processing chamber as well as the capabilities of a vacuum system coupled thereto. Additionally, the dose time of a source gas may vary according to the flow rate of the source gas, the temperature of the source gas, the type of control valve, the type of process chamber employed, as well as the ability of the components of the source gas to adsorb onto the substrate surface. Dose times may also vary based upon the type of layer being formed and the geometry of the device being formed. In some embodiments, the duration for each pulse/dose or "dose time" may be about 12 second or less. However, a dose time can range from microseconds to milliseconds to seconds, and even to minutes. A dose time should be long enough to provide a volume of compound sufficient to adsorb/chemisorb onto substantially the entire surface of the substrate and form a layer of the source gas component thereon.

In some embodiments, each source gas may be separated by a time delay/pause to allow the components of the source gas to adhere and/or react on the substrate surface. A pause between pulses of the first source gas and the second source gas may be about 2.0 second or less, about 1.0 seconds or less, or about 0.5 seconds or less. A pause after the pulse of the first source gas may also be about 2.0 second or less, about 1.0 seconds or less, or about 0.5 seconds or less. In some embodiments, at least a portion of a pulse of the first source gas may still be in the chamber when at least a portion of a pulse of the second source gas enters, so that a primer chemisorption enhanced by co-reaction takes place on the surfaces of the substrate.

In some embodiments, forming the dielectric layer at 104 may include exposing the substrate to a first source gas, as shown at 106. In some embodiments, such as where a metal silicate dielectric layer is formed via an ALD process, the first source gas may comprise a silicon precursor and an oxidizer. The oxidizer may act as a catalyst with respect to the silicon precursor to increase its reactivity while eliminating gas-phase reactions. The first source gas forms a first layer of silicon and oxygen on the surface of the substrate.

The silicon precursor may comprise any suitable silicon containing precursor such as, silicontetrachloride ($SiCl_4$), silane ($SiH_4$), disilane ($Si_2H_6$), chlorosilane, dichlorosilane ($SiH_2Cl_2$), or hexachlorodisilane ($Si_2Cl_6$), or the like. In some embodiments, the silicon precursor may be a vaporized liquid precursor, such as tris[dimethylamino]silane ($[((CH_3)_2)N]_3SiH$). (TDMAS). The TDMAS may be provided between about 5 to about 50 mg/min, for example, about 20 mg/min.

The oxidizer may comprise water vapor ($H_2O$), oxygen ($O_2$), ozone ($O_3$), nitrogen oxides (e.g., $N_2O$, $NO$, $N_2O_5$, $NO_2$), or the like. In some embodiments, the oxidizing gas is produced from a water vapor generating (WVG) system that is in fluid communication to the process chamber 200. The WVG system generates ultra-high purity water vapor by means of a catalytic reaction of $O_2$ and $H_2$. The WVG system has a catalyst-lined reactor or a catalyst cartridge in which water vapor is generated by means of a chemical reaction, unlike pyrogenic generators that produce water vapor as a result of ignition. Regulating the flow of $H_2$ and $O_2$ allows the concentration to be precisely controlled at any point from 1% to 100% concentrations. In some embodiments, the ratio of $O_2$ to $H_2$ is between about 14:20 to about 21:20, or about 21:20. The water vapor may contain water, $H_2$, $O_2$ and combinations thereof. Suitable WVG systems are commercially available, such as the WVG by Fujikin of America, Inc., located in Santa Clara, Calif. and the CSGS (Catalyst Steam Generator System) by Ultra Clean Technology, located in Menlo Park, Calif.

In some embodiments, the first source gas comprising the silicon precursor may be provided in one or more pulses at a flow rate between about 5 to about 50 mg/min for a time period of up to about 2 seconds. In some embodiments, the first source gas is not pulsed and provided at a constant flow rate of between about 5 to about 50 mg/min for a time period of between about 1 to about 5 seconds. In some embodiments, the oxidizer may be provided at least in a portion of one or more pulses of the first source gas at a flow ratio of between about 14:20 to about 21:20 for a time period of between about 0.5 to about 2 seconds.

Next, at 108, the substrate may be exposed to a second source gas. In some embodiments, the second source gas may comprise a metal precursor and a silicon precursor. The second source gas forms a second layer comprising the metal and silicon atop the first layer. The first layer and second layer react, forming the dielectric layer.

In some embodiments, for example, such as where a hafnium silicate dielectric layer is formed, the metal precursor may comprise $(RR'N)_4Hf$ where R or R' may independently be one of hydrogen, methyl, ethyl, propyl or butyl. In some embodiments, the hafnium precursor may be a vaporized liquid precursor, such as tetrakis[diethylamino]hafnium $[Hf[N(C_2H_5)_2]_4]$ (TDEAH). The TDEAH may be provided between about 5 to about 50 mg/min, or at about 8 mg/min.

The silicon precursor may comprise any suitable silicon containing precursor such as, silicontetrachloride ($SiCl_4$), silane ($SiH_4$), disilane ($Si_2H_6$), dichlorosilane ($SiH_2Cl_2$) or the like. In some embodiments, the silicon precursor may be a vaporized liquid precursor, such as tris[dimethylamino] silane $[(CH_3)_2)N]_3SiH]$ (TDMAS). The TDMAS may be provided between about 5 to about 50 mg/min, or about 20 mg/min. In some embodiments, the silicon precursor may be the same silicon precursor as used in the first source gas at 106.

In some embodiments, the second source gas may be provided in one or more pulses at a flow rate between about 5 to about 50 mg/min for a time period of up to about 5 seconds. The metal precursor and silicon precursor may be provided at a flow rate ratio of metal precursor to silicon precursor between about 8:50 to about 8:20.

In some embodiments, the second source gas may be provided prior to the first source gas. For example, in some embodiments, such as where a metal silicate dielectric layer is formed via an ALD process, the first source gas may comprise a metal precursor and a silicon precursor and the second source gas may comprise a silicon precursor and an oxidizer. In such embodiments, the substrate may first be exposed to a source gas comprising a metal precursor and a silicon precursor to form a first layer of the metal and silicon. The substrate may then be exposed to an oxidizer and a silicon precursor forming a second layer of silicon and oxygen, which reacts with the first layer, forming the metal silicate dielectric layer.

In any of the above embodiments, the flow rates and/or durations of each pulse may be the same or may vary over the course of the total pulses required to form a particular dielectric layer, thereby facilitating layers having either uniform or graded compositions.

In any of the above embodiments, each cycle consisting of a pulse of the first source gas, and pulse of the second source gas, provides a hafnium silicate layer having a thickness between about 1.0 and about 1.2 Å. The alternating sequence may be repeated until the desired thickness is achieved. Accordingly, the deposition process may require between 10 and 50 cycles, or between about 50 and 150 cycles.

In addition to the foregoing, additional process parameters may be regulated while depositing the dielectric layer to the desired thickness. In some embodiments, the process chamber may be maintained at a pressure of between about 0.5 to about 1 Torr. In some embodiments, the temperature of the process chamber is maintained at a temperature below the precursor thermal decomposition limit to suppress a gas-phase reaction. In some embodiments, the temperature of the process chamber may be maintained below 300 degrees Celsius. In some embodiments, the substrate temperature may be maintained between about 150 degrees Celsius to about 200 degrees Celsius. The processing time may be set at a predetermined processing period or after a desired thickness of the dielectric layer is deposited on the substrate. In some embodiments, the processing time may be between about 360 to about 3600 seconds.

In any of the above embodiments, an inert gas, such as argon, helium, hydrogen, nitrogen, or the like, may also be provided to the process chamber. For example, in some embodiments, each pulse may be performed sequentially, and may be accompanied by a flow of an inert gas at a rate between about 450 sccm and about 1500 sccm, or about 900 sccm. The inert gas may also be provided to the process chamber subsequent to each exposure of the substrate to the first of second source gas. The inert gas may be pulsed between each pulse of the reactive compounds. For example in some embodiments, the inert gas may be provided between about 1000 to about 2500 sccm, or about 2200 sccm, for up to about 12 seconds to the process chamber between exposing the substrate to the first source gas and the second source gas or between the second source gas and the first source gas. In some embodiments, the inert gas may be continuously provided to the process chamber throughout the process at the same rates as discussed above, or in some embodiments, less.

The flow of inert gas, whether pulsed or continuous, may facilitate removing any excess reactants from the reaction zone to prevent unwanted gas phase reactions of the reactive compounds, and may also remove any reaction by-products from the processing chamber, similar to a purge gas. In addition to these benefits, the continuous flow of non-reactive gas helps deliver the pulses of reactive compounds to the substrate surface similar to a carrier gas.

Next, at 110, it is determined whether the dielectric layer has achieved a predetermined thickness. If the predetermined thickness has been achieved the method 100 ends at 112 and the substrate can proceed for any further processing. If the predetermined thickness has not been achieved, the method 100 returns to 104 to continue forming the dielectric layer.

Although the embodiments of the invention are described to deposit hafnium-containing compounds, a variety of metal oxides and/or metal silicates may be formed outside of the hafnium-containing compounds by alternately pulsing metal precursors with oxidizing gas derived from a WVG system, such as a fluid of water vapor. The ALD processes disclosed above may be altered by substituting the hafnium and/or silicon precursors with other metal precursors to form materials, such as hafnium aluminates, titanium silicates, zirconium oxides, zirconium silicates, zirconium aluminates, tantalum oxides, tantalum silicates, titanium oxides, titanium silicates, silicon oxides, aluminum oxides, aluminum silicates, lanthanum oxides, lanthanum silicates, lanthanum aluminates, nitrides thereof, and combinations thereof.

Figure 2:
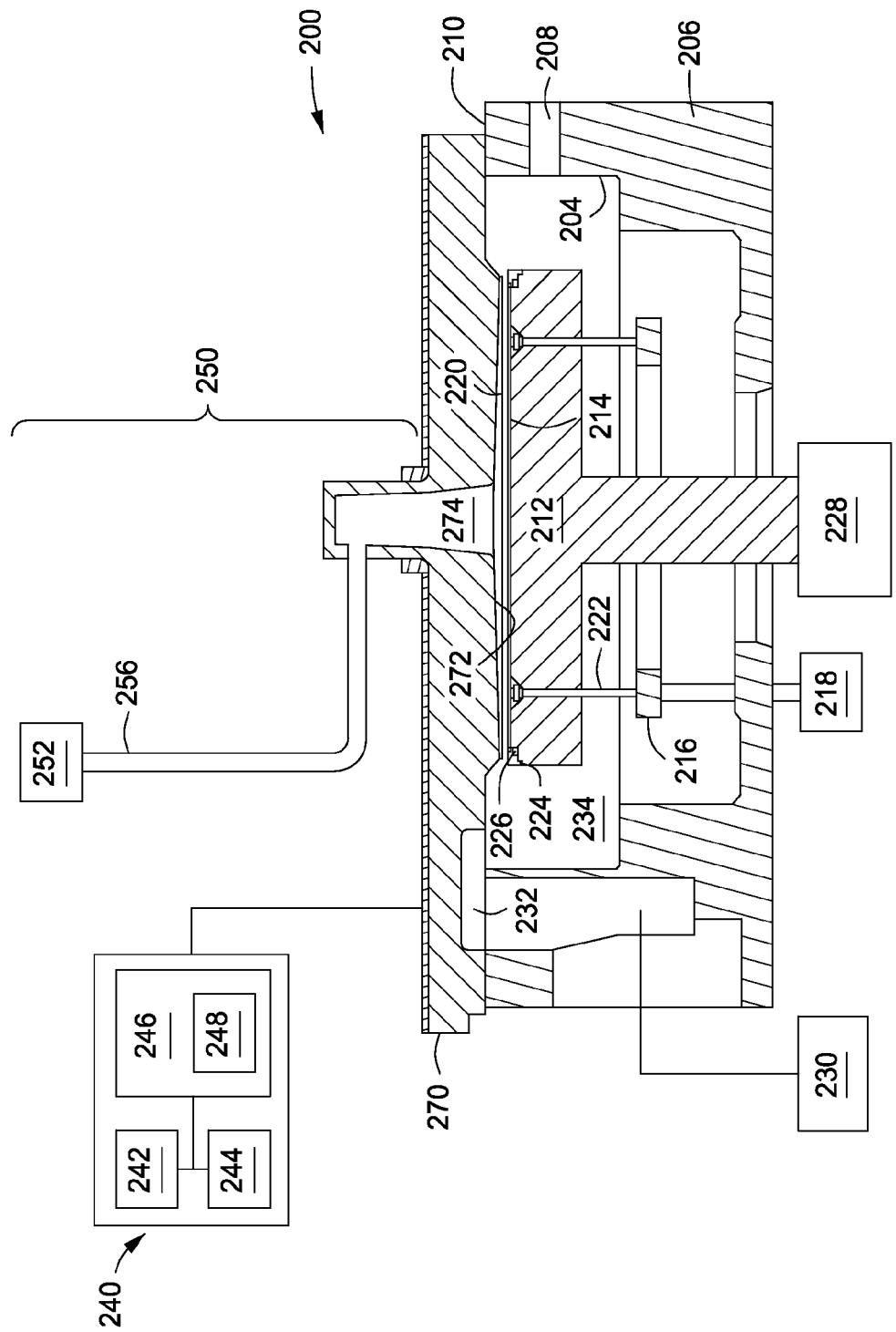
FIG. 2 depicts an apparatus suitable for processing semiconductor substrates in accordance with some embodiments of the present invention.

FIG. 2 is a schematic cross-sectional view of an embodiment of an apparatus 200 that may be used to perform embodiments of the present invention. The apparatus may be any suitable apparatus for processing substrates, for example, the GEMINI ALD chamber, available from Applied Materials, Inc., of Santa Clara, Calif.

The process chamber 200 generally comprises a chamber body 210 having an inner volume 234 with a substrate support 212 disposed therein. The chamber body 210 further comprises sidewalls 204 and a bottom portion 206. A slit valve 208 disposed in a sidewall 204 of the chamber body 210 provides access for a robot (not shown) to deliver and retrieve a substrate 220.

A substrate support 212 supports the substrate 220 on a substrate receiving surface 214. The substrate support (or pedestal) 212 is mounted to a lift motor 228 to raise or lower the substrate support 212 and a substrate 220 disposed thereon. A lift plate 216 coupled to a lift motor 218 is mounted in the process chamber 200 and raises or lowers pins 222 movably disposed through the substrate support 212. The pins 222 raise or lower the substrate 220 over the surface of the substrate support 212. In some embodiments, the substrate support 212 includes a vacuum chuck, an electrostatic chuck, or a clamp ring for securing the substrate 220 to the substrate support 212.

The substrate support 212 is heated to increase the temperature of the substrate 220 disposed thereon. For example, the substrate support 212 may be heated using an embedded heating element, such as a resistive heater or may be heated using radiant heat, such as heating lamps disposed above the substrate support 212. A purge ring 224 is disposed on the substrate support 212 to define a purge channel 226 which provides a purge gas to a peripheral portion of the substrate 220 to prevent deposition thereon.

An exhaust system 230 is in communication with a pumping channel 232 to evacuate any undesirable gases from the process chamber 200. The exhaust system 230 also helps in maintaining a desired pressure or a desired pressure range inside the process chamber 200.

The gas delivery system 250 is coupled to the chamber body 210 to provide precursor(s), carrier gases and/or purge gases to the process chamber 200. The gas delivery system 250 includes a gas source 252 and a conduit 256. The conduit 256 couples the gas source 252 to the process chamber 200. In some embodiments, the gas delivery system 250 may comprise additional elements to facilitate providing a plurality of different gases in a continuous flow or by pulsing. For example, multiple gas sources may be included to provide multiple gases. Additionally, one or more valves, such as a switching valve, high speed valve, stop valve, or the like, may be included to facilitate pulsing each source gas.

In some embodiments, for example, such as where a solid or liquid precursor is utilized, the gas delivery system 250 may also comprise one or more ampoules. In such embodiments, the one or more ampoules may be configured to allow the solid or liquid precursor to be contained and sublime into gaseous form for delivery into the process chamber 200.

Returning to FIG. 2, at least a portion of a bottom surface 272 of a chamber lid 270 may be tapered from an expanding channel 274 to a peripheral portion of the chamber lid 270. The expanding channel 274 improves velocity profile of gas flow from the expanding channel 274 across the surface of the substrate 220 (i.e., from the center of the substrate to the edge of the substrate). In some embodiments, the bottom surface 272 comprises one or more tapered surfaces, such as a straight surface, a concave surface, a convex surface, or combinations thereof. In some embodiments, the bottom surface 272 is tapered in the shape of a funnel. The expanding channel 274 is one exemplary embodiment of a gas inlet for delivering the sublimed precursor and carrier gas from the conduit 256 to the substrate 220. Other gas inlets are possible, for example, a funnel, a non-tapering channel, nozzles, showerheads, or the like.

A controller 240, such as a programmed personal computer, work station computer, or the like is coupled to the process chamber 200. Illustratively, the controller 240 comprises a central processing unit (CPU) 242, support circuitry 244, and a memory 246 containing associated control software 248. The controller 240 controls the operating conditions of processes performed in the process chamber, such as, for example, an ALD process. For example, the controller 240 may be configured to control the flow of various precursor gases and purge gases from the gas delivery system 250 to the process chamber 200 during different stages of the deposition cycle.

While the foregoing is directed to embodiments of the present invention, other and further embodiments of the invention may be devised without departing from the basic scope thereof.

The invention claimed is:

1. A method for forming a dielectric layer on a substrate, comprising:
   (a) exposing the substrate to a first source gas comprising a silicon precursor and an oxidizer for a first period of time to form a first layer comprising silicon and oxygen; and
   (b) exposing the substrate to a second source gas comprising a metal precursor and the silicon precursor for a second period of time to form a second layer comprising silicon and a metal, where in the first layer and the second layer form the dielectric layer.

2. The method of claim 1, wherein the dielectric layer comprises hafnium silicate (HfSiO), hafnium silicon nitride (HfSiN), or aluminum silicon oxynitride (AlSiON).

3. The method of claim 1, wherein the silicon precursor comprises at least one of silicontetrachloride ($SiCl_4$), silane ($SiH_4$), disilane ($Si_2H_6$), chlorosilane ($SiH_3Cl$), dichlorosilane ($SiH_2Cl_2$), trichlorosilane ($SiHCl_3$), hexachlorodisilane ($Si_2Cl_6$), or tris[dimethylamino]silane ($[((CH_3)_2)N]_3SiH$).

4. The method of claim 1, wherein the oxidizer comprises at least one of water vapor ($H_2O$) or ozone ($O_3$).

5. The method of claim 1, wherein a flow rate ratio of the silicon precursor to the oxidizer is about 14:20 to about 21:20.

6. The method of claim 1, wherein the first source gas and the second source gas are each provided at a flow rate of about 5 to about 50 mg/min.

7. The method of claim 1, wherein the first period of time is up to about 2 seconds.

8. The method of claim 1, wherein the metal precursor comprises at least one of hafnium tetrachloride ($HfCl_4$), hafnium fluoride ($HfF_4$), hafnium bromide ($HfBr_4$), or tetrakis[diethylamino]hafnium ($Hf[N(C_2H_5)_2]_4$).

9. The method of claim 1, wherein a flow rate ratio of the metal precursor to the silicon precursor is about 8:50 to about 8:20.

10. The method of claim 1, wherein the second period of time is up to about 3 seconds.

11. The method of claim 1, further comprising:
   repeating (a) and (b) to form the dielectric layer to a desired thickness.

12. The method of claim 1, further comprising:
   supplying an inert gas for a period of time while performing at least one of (a) or (b).

13. The method of claim 1, further comprising:
   purging the process chamber with an inert gas between performing (a) and (b).

14. The method of claim 1, wherein the first source gas or second source gas further comprises an inert gas.

15. The method of claim 1, further comprising:
   maintaining the process chamber at a temperature of about 150 to about 300 degrees Celsius.

16. A computer readable medium, having instructions stored thereon which, when executed by a controller, causes a process chamber having a substrate disposed therein to have a dielectric layer formed thereon by a method, the method comprising:
   (a) exposing the substrate to a first source gas comprising a silicon precursor and an oxidizer for a first period of time to form a first layer comprising silicon and oxygen; and
   (b) exposing the substrate to a second source gas comprising a metal precursor and the silicon precursor for a second period of time to form a second layer comprising silicon and a metal, wherein the first layer and the second layer form the dielectric layer.

17. The computer readable medium of claim 16, wherein the method further comprises:
   repeating (a) and (b) to form the dielectric layer to a desired thickness.

18. The computer readable medium of claim 16, wherein the method further comprises:
   maintaining the process chamber at a temperature of about 150 to about 300 degrees Celsius.

19. The computer readable medium of claim 16, wherein the method further comprises:
   purging the process chamber with an inert gas between (a) and (b).

20. The computer readable medium of claim 16, wherein the method further comprises:
   supplying an inert gas for a period of time while performing at least one of (a) or (b).

* * * * *

UNITED STATES PATENT AND TRADEMARK OFFICE
CERTIFICATE OF CORRECTION

PATENT NO. : 8,507,389 B2  
APPLICATION NO. : 12/835866  
DATED : August 13, 2013  
INVENTOR(S) : Date et al.

Page 1 of 1

It is certified that error appears in the above-identified patent and that said Letters Patent is hereby corrected as shown below:

In the Specification

In column 1, line 48, after "silicon" delete "(Si)".

Signed and Sealed this
Fifteenth Day of October, 2013

Teresa Stanek Rea
*Deputy Director of the United States Patent and Trademark Office*